United States Patent [19]
Pellegrini

[11] Patent Number: 5,163,179
[45] Date of Patent: Nov. 10, 1992

[54] PLATINUM SILICIDE INFRARED DIODE

[75] Inventor: Paul W. Pellegrini, Bedford, Mass.

[73] Assignee: The United States of America as represented by the Secretary of the Air Force, Washington, D.C.

[21] Appl. No.: 808,497

[22] Filed: Dec. 17, 1991

Related U.S. Application Data

[62] Division of Ser. No. 736,376, Jul. 18, 1991.

[51] Int. Cl.$^5$ .............................................. H01L 27/14
[52] U.S. Cl. .................................. 257/451; 257/452; 257/455; 257/627
[58] Field of Search ................. 357/30 C, 30 R, 30 Q, 357/30 H, 67 S, 15, 24 LR, 52, 52 D, 60

[56] References Cited

U.S. PATENT DOCUMENTS

| | | | |
|---|---|---|---|
| 3,864,722 | 2/1975 | Carnes | 357/24 |
| 4,346,291 | 8/1982 | Chapel, Jr. et al. | 250/211 R |
| 4,531,055 | 7/1985 | Shepherd, Jr. et al. | 250/211 J |
| 4,533,933 | 8/1985 | Pellegrini et al. | 357/30 C X |
| 4,536,658 | 8/1985 | Ludington | 250/578 |
| 4,620,231 | 10/1986 | Kosonocky | 358/213 |
| 4,864,378 | 9/1989 | Tsaur | 357/30 C |
| 4,876,586 | 10/1989 | Dyck et al. | 357/30 C |

OTHER PUBLICATIONS

Kimata et al., "A 512×512-Element PtSi Schottky-Barrier Infrared Image Sensor," *IEEE Journal of Solid-State Circuits*, vol. SC-22, No. 6, Dec. 1987, pp. 1124-1129.

*Primary Examiner*—William Mintel
*Attorney, Agent, or Firm*—William G. Auton; Donald J. Singer

[57] ABSTRACT

Platinum Silicide (PtSi) layers formed on silicon substrates are well known for their ability to image in the infrared portion of the electromagnetic spectrum out to 5.75 micrometers. The detectors are formed on p-type silicon substrates of <100> orientation. This is the preferred crystal structure for silicon when used for fabrication of Very Large Scale Integration (VLSI). The cooling required for these devices is 77° K., which is needed to reduce thermal currents in the diodes to be significantly below the infrared generated signal. Detector array operation at these temperatures does not allow for operation in space for extended missions because a closed cycle mechanical cooler must be used. We have developed a new PtSi detector which must be fabricated on p-type silicon having a <111> crystal orientation. The detectors have been measured for their cutoff wavelength and barrier height is 0.310 eV which translates to a cutoff wavelength of 4.0 micrometers. The cooling required to operate these new devices is 110° K. This means that they can be used in space applications where passive cooling is required.

4 Claims, 3 Drawing Sheets

PLATINUM SILICIDE INFRARED DIODE

STATEMENT OF GOVERNMENT INTEREST

The invention describes herein may be manufactured and used by or for the Government for governmental purposes without the payment of any royalty thereon.

This application is a division of application Ser. No. 07/736,376, filed 18 Jul. 1991.

BACKGROUND OF THE INVENTION

The present invention relates generally to solid state infrared radiation detectors, and more particularly, to an improved Platinum Silicide infrared diode. Note that this diode is used as a photodetector, so the terms "diode" and "detector" are sometimes used interchangeably in the description that follows.

All high performance infrared imagers require the detecting devices to be cooled. The longer the cutoff wavelength of the device, the more cooling is required. Doped silicon devices, Si:X, operate out beyond 20 micrometers in the very long wave infrared, but they require cooling to less than 13° K. Mercury Cadmium Telluride detectors have the promise of working over the spectral range of 2 to 20 micrometers depending upon the fraction of mercury in the structure. Theoretically, they should operate at relatively high temperatures. Another detector material which has shown promise in the 3.0 to 5.0 micrometer band is Indium Antimonide (InSb). Theoretical calculations show that it should have cooling requirements in the 110° K. range.

Unfortunately, these materials are compound semiconductors and are extremely difficult to fabricate. The individual detectors have been formed in the laboratory with the characteristics mentioned. However, in a real infrared system, large one or two dimensional arrays of diodes must be fabricated. Whenever large arrays are required of compound semiconductors, the arrays do not have the same characteristics as the individual diodes. This occurs because of the high degree of surface and bulk imperfections found in the compound semiconductor substrates. The operating temperatures which are predicted are never realized in finished arrays. Both InSb and HgCdTe usually require large arrays to be cooled to 77° K. for proper low noise operation, regardless of theoretical calculations.

Schottky barrier diodes made from platinum silicide (PtSi) layers on silicon substrates are extremely promising for large two dimensional infrared focal planes. These devices are formed on industry standard silicon substrates of <100> orientation and have outstanding imaging characteristics in the 3.0 to 5.0 micrometer infrared atmospheric window. Unfortunately, these detectors also require cooling to 77° K. for proper operation and suppression of thermal currents.

An infrared system which must be operated in space requires high reliability and as few moving parts as possible. The usual cooling method for infrared arrays in a terrestrial environment is a closed cycle refrigerator with many, moving parts. In space applications, system designers prefer to use passive cooling, which allows no moving parts. It works by radiating heat out to deep space. The minimum temperature achievable with this method of operation is about 105° K. In order for an infrared imaging system to use passive cooling it must operate above this temperature.

The infrared devices described so far do not have the ability to operate at this temperature because of various technical problems. The task of providing improved infrared diode detectors is alleviated, to some extent, by the systems disclosed in the following U.S. Patents, the disclosures of which are incorporated herein by reference:

U.S. Pat. No. 4,536,658 issued to Charlotte Ludington;
U.S. Pat. No. 4,533,933 issued to Paul Pellegrini et al;
U.S. Pat. No. 4,531,055 issued to Freeman Shepherd et al;
U.S. Pat. No. 3,864,722 issued to Carnes;
U.S. Pat. No. 4,346,291 issued to Chapel; and
U.S. Pat. No. 4,620,231 issued to Kosonocky.

The above-cited Ludington, Pellegrini and Shepherd references all describe infrared detector systems.

The patent to Carnes describes radiation sensing arrays which applies layers of n-type silicon and p-type silicon over the Schottky barrier layer. The patent to Chapel teaches a thermally isolated monolithic die using a layer of <100> crystal material of silicon dioxide ($SiO_2$) wherein platinum silicide (PtSi) windows are formed in a protective layer. The patent to Kosonocky teaches a charge coupled diode (CCD) which employs a (PtSi) layer over line p-type silicon substrate.

The need remains to provide an IR detector which is able to operate at 105° K. (or above) such that it requires only passive cooling. The present invention will allow the use of platinum silicide infrared detectors in infrared systems which are required to use passive cooling techniques. Previous technology has used PtSi infrared arrays fabricated on semiconductor grade silicon substrates of 100 crystallographic orientation. The new detectors must use a different silicon orientation, but in so doing they will allow detector operation at temperatures in the range of 110° K. At this temperature, passive cooling in space can be accomplished.

SUMMARY OF THE INVENTION

The present invention includes an infrared detector diode which is capable of operating at temperatures in the 110° K. temperature range. The device comprises a platinum silicide (PtSi) detector diode which must be fabricated on a p-type silicon substrate that has a <111> crystalline orientation. The detectors have measured a barrier height of 0.310 eV (electron volt) which translates to a cutoff wavelength of 4.0 micrometers. The cooling required to operate the device is 110° K. This means that the invention is capable of use in space applications and other enviornments where passive cooling (i.e. no moving parts) is required.

One embodiment of the invention includes: a p-type silicon substrate with <111> crystalline orientation; a guard ring of n-type material; an $SiO_2$ protective layer; a PtSi layer, aluminum contacts which cover the guard ring; a heavily doped p+ layer; and an aluminum substrate contact. The process for fabricating the platinum silicide detector diode is summarized below.

The fabrication process for making of the present invention is a nine step operation that begins by selecting a lightly doped p-type silicon substrate with a <111> crystalline orientation to serve as a substrate for the wafer. In one embodiment of the invention the silicon substrate had a 10–20 ohm-cm resistivity.

In the second step of the process the silicon substrate is oxidized with a 4,000 angstrom layer of $SiO_2$ which will passivate the silicon surface, and which will serve as the protective layer as described in the above-cited Pellegrini et al patent.

In the third step of the process, a heavily doped p+ layer is grown over the substrate contact area using photolithography. When this area is capped with a metal contact during metallization, the substrate contact will be complete.

On the fourth step of the process, an n-type guard ring of $10^{16}$ cm$^{-3}$ phosphorous is placed around the periphery of the detector and annealed. The purpose of the guard ring is to suppress edge leakage in the detector portion of the wafer.

In the fifth step of the process, a wet chemical etch opens the active area of the detector to enable the PtSi area to be formed in the sixth step.

In the sixth step of the process, platinum is evaporated from an electron beam source. The silicon surface is extremely reactive, and PtSi layers form at room temperature as soon as the evaporated metal atoms hit the silicon surface.

In the seventh step of the process, the reaction of the sixth step is enhanced by heating the wafer at 350° C.

In the eighth step, the wafer is worked in an aqua regia acid solution to remove Pt from the SiO$_2$ regions.

The ninth step is the metallization step in which aluminum contacts are applied to the substrate contact area and over the guard ring. Note that the aluminum forms an annular ring over the guard ring area.

In operation, the PtSi detector is illuminated from the side of the silicon substrate. The silicon is transparent to the IR photons, which are absorbed by the PtSi layer. This absorption creates the hole-elecion pairs in the PtSi layer near the metal contacts. The silicon substrate uses a <111> crystalographic orientation, and the entire IR detector is capable of operation at temperatures in the range of 110° K. At this temperature passive cooling in space can be accomplished, and complicated, heavy cooling systems are not required.

It is an object of the present invention to provide a process for manufacturing an improved Schottky barrier diode that is capable of operating at 100° K. or above.

It is a further object of the present invention to produce detector systems which are capable of operating in space applications where passive cooling is required.

These and other objects, advantages and features of this invention will become apparent upon consideration of the following detailed description thereof when taken in conjunction with the accompanying drawings wherein like elements are given like reference numerals.

DETAILED DESCRIPTION OF THE PREFERRED EMBODIMENT

The present invention includes a new PtSi infrared detector diode on lightly doped silicon substrates with <111> crystalline orientation. Measurements on fabricated detecting devices show that the height of the electronic barrier to photogenerated carriers is substantially larger than on <100>. In order to operate as an infrared photon detector, the thermally generated carriers must be a factor of 10 lower than the photon generated signal. In detectors using PtSi on <100> silicon, this means cooling to 77° K. The higher electronic barrier of PtSi on <111> silicon translates into an operating temperature of 110° K. for these detectors.

Figure 1:
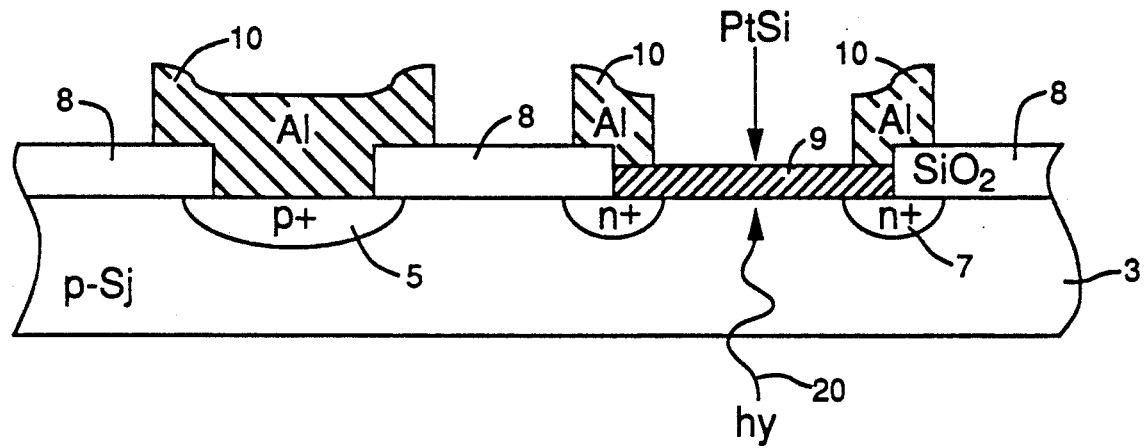
FIG. 1 is a pictorial illustration shown of a cross section of a PtSi infrared diode constructed in accordance with the present invention.

The reader's attention is now directed towards FIG. 1 which is a cross section view of the PtSi infrared diode of the present invention. The IR diode of FIG. 1 includes: a p-type silicon substrate with <111> crystalline orientation 3; a guard ring of n-type material 7; an SiO$_2$ protective layer 8; a PtSi layer 9, aluminum contacts 10 which cover the guard ring; a heavily doped p+ layer 5; and an aluminum substrate contact 11. Some of the features of the system of FIG. 1 are found in the above-cited Pellegrini et al reference. For example, the guard ring of n-type material 7 is used to prevent current leakage, and the aluminum contact 10 is over the guard ring. Also, the SiO$_2$ protective layer is formed from the guard ring on out to the edge of the substrate.

The detector diodes are fabricated in the form of a wafer by electron beam evaporation of platinum metal onto a silicon substrate. In order to assure that our results were not due to sample preparation, we evaporated both <111> and <100> substrates at the same time. A cross section of a finished detector diode is shown in FIG. 1. The silicon starting material is lightly doped p-type with 10-20 ohm-cm resistivity. It is obtained from industrial merchant suppliers and is a special order item since <100> crystal orientation is standard. The wafer is oxidized with a 4000 angstroms thick layer of SiO$_2$ which is used to passivate the silicon surface. A heavily doped p+ layer 5 is grown over the substrate contact area using industry standard photolithography techniques. An n-type guard ring 7 of $10^{16}$ cm$^{-3}$ phosphorous atoms is placed around the periphery of the detector. These ions are annealed and activated at 950° C. in a tube furnace. The guard ring 7 is required in this structure to suppress edge leakage which occurs at the outer periphery of the diode because of the small radius of curvature caused by the thin PtSi detector layer. The active area 9 of the photodetecting device is then opened with a wet chemical etch (which exposes the silicon substrate 3 by eating away a portion of the protective layer 8) and the wafer is placed in an electron beam evaporator with ultimate vacuum capability of less than 10$^{-7}$ Torr.

Platinum is evaporated from an electron beam source. The starting platinum metal is of 99.99% purity. The thickness is controlled by the use of a shutter which covers the diode. The thickness of Pt metal is determined by using a quartz vibrating crystal monitor. The silicon surface is extremely reactive and PtSi layers form at room temperature as soon as the evaporated metal atoms hit the surface. This reaction is enhanced by heating the platinum coated substrate to 350° C. in-situ. The layers formed using this procedure are more uniform and the reaction of Pt+Si→PtSi goes to completion more rapidly. Once the PtSi layer of the active area 9 is formed, the silicon surface is completely passivated. The Pt which is evaporated on the SiO₂ regions does not react. The wafer is removed from the vacuum system and washed in a standard aqua regia acid solution which selectively removes the platinum from the SiO₂ but leaves the PtSi infrared photodiode untouched. The final step in preparation of the wafer is to put aluminum contacts 10 and 11 on both the substrate and the PtSi Schottky diode. The aluminum diode contact 10 in FIG. 1 is shown as an annular ring which contacts the diode only over the guard ring areas. This leaves no thick aluminum over the diode active sensing area. This is important since it is known that the photon quantum efficiency of Schottky diodes is dependent upon the layer of metal. Thick layers can reduce the emission efficiency by a factor of 10.

Infrared detecting photodiodes have been fabricated on both <111> and <100> substrates using the processing sequence described above. Platinum films were evaporated and thicknesses from 5 angstroms through 100 angstroms formed into PtSi layers. They have been characterized using both electronic and optical methods. The optical method involves shining a monochromatic beam of light from a spectrometer onto the diode which is mounted in a refrigerator and is sufficiently cooled to eliminate all thermal emission currents. The spectrometer generates a nearly monochromatic beam of light at discreet wavelengths from 1.0 through 6.0 micrometers and the optics in the instrument directs the light at the detector. The detector is illuminated through the silicon wafer as shown in FIG. 1.

Whenever a metal and semiconductor are placed in intimate contact, such as in a Schottky diode, a barrier to the flow of electronic charges is formed. The height of this barrier determines the minimum energy carrier which can be transmitted from the diode into the silicon. The detection mechanism in these diodes is emission of photo generated hot carriers over the barrier. The carriers are generated by the absorption of photons in the PtSi metal-like region. If the hot carriers are moving toward the barrier and they have greater energy than the barrier, then they will be emitted over the barrier and collected as single charge. Many of the carriers are not directed at the barrier, but because of their state of excitation move about inside the metal. This movement causes them to collide with lattice phonons, grain boundaries, and the front and back surfaces of the metal layer. Each of these collisions is considered diffuse rather than specular and randomly reorients the carrier. This can give the excited carrier another chance for emission, and in fact each collision is randomizing and causes an enhanced photoemission signal.

Schottky photoemission is characterized by the modified Fowler relationship $$Y = C_s [h\gamma - \phi_o]^2 / h\gamma$$

where:
Y=quantum efficiency in electrons per photon
Cs=Schottky emission constant in %/eV
$h_\nu$=Incident photon energy
$\phi_o$=Barrier height to optically generated carriers This equation can be linearized for easier extraction of the barrier height and the emission constant.

$$\sqrt{(Y h\nu)} = \sqrt{(C_s)} [h\nu - \phi_o]$$

Figure 2:
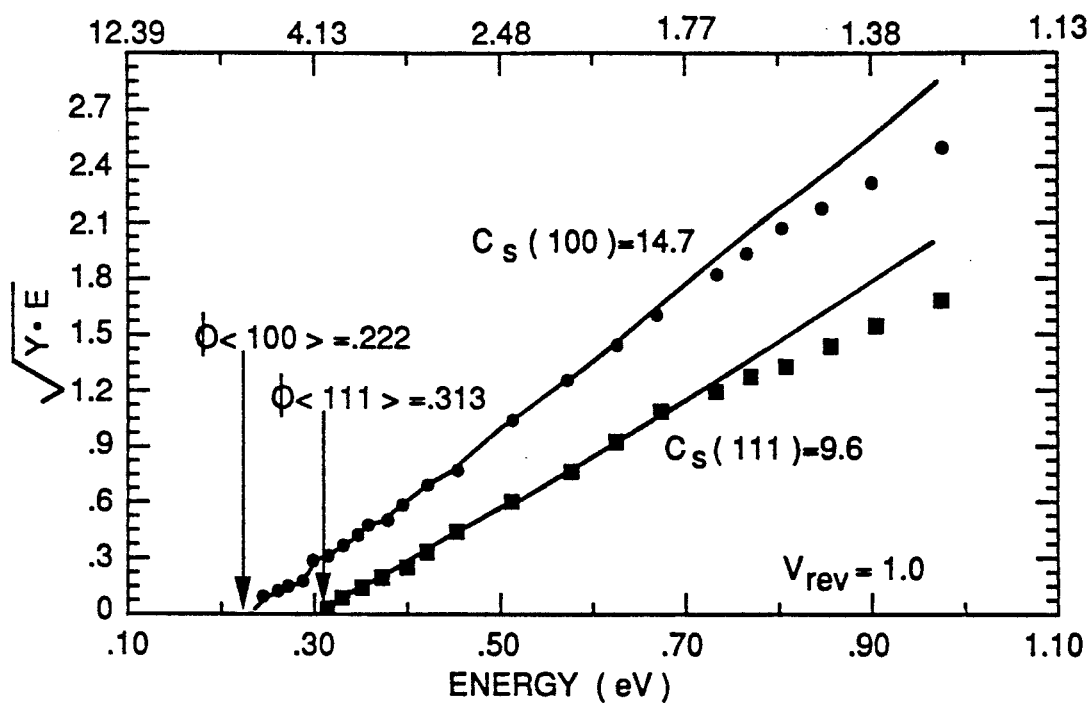
FIG. 2 is a graph depicting the photon energy of the diode on different substrates.

According to this equation, a plot of $\sqrt{(Y h\nu)}$ vs. h will give a straight line whose slope is $\sqrt{(C_s)}$ and whose intercept along the energy axis is the optical barrier height $\phi_o$. FIG. 2 shows the Fowler photoemission plots for diodes fabricated at the same time on both <111> and <100> substrates. The barrier heights are determined by least mean squares fitting on the linear portion of the data. The barrier height for the <111> diode is 0.310 eV and for the diode is 0.220 eV. The emission constants extracted from the slopes of the curves are Cs (111)=9.2 and Cs (100)=14.7.

The cutoff wavelength derived from this measurement is found to be 4.0 micrometers.

Figure 3:
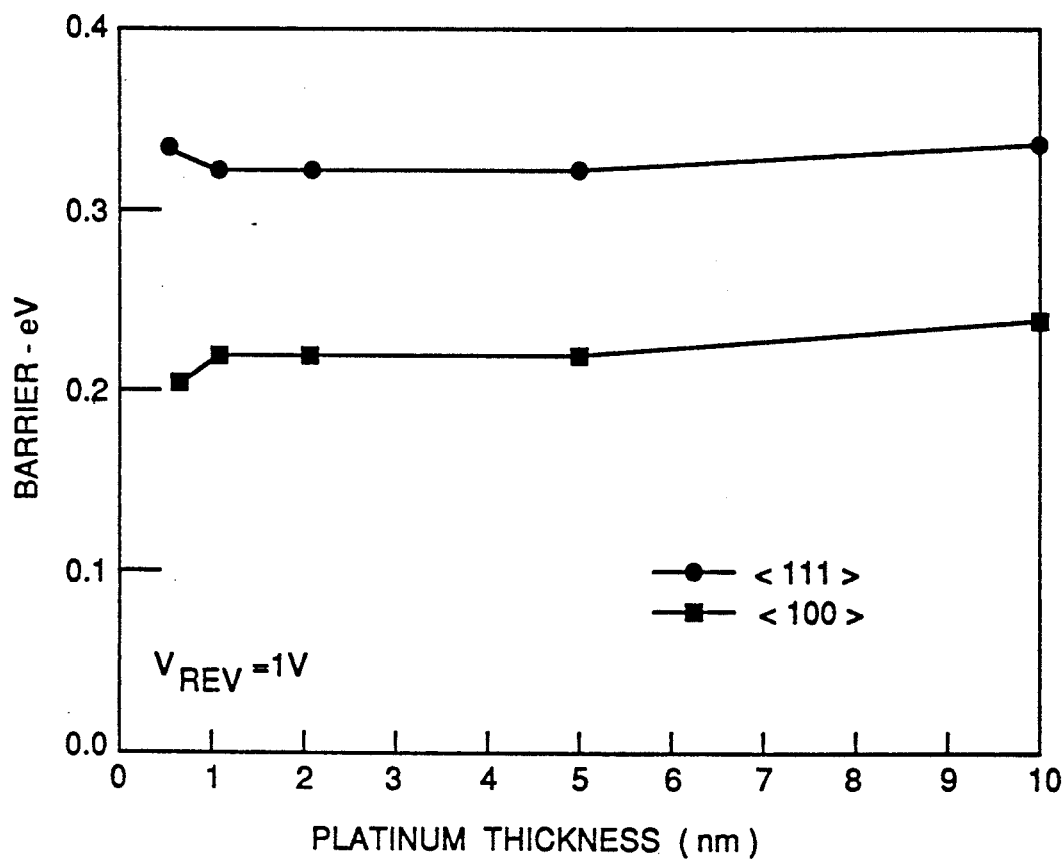
FIG. 3 is a graph illustrating the optical barrier heights of substrates with <111> and <100> crystal orientation.

A series of experiments have been performed to ascertain the variability of optical Schottky barrier height with thickness of deposited platinum. Layers in a thickness range of 5 angstroms through 100 angstroms in logarithmic steps have been made. Again, both <111> and <100> substrates were used to assure that sample preparation before and after detector fabrication were not responsible for the high temperature detector diodes. FIG. 3 shows the results of the optically derived barrier heights for the two different substrate orientations plotted against thickness. The average optical barrier for <111> substrates is 0.313 eV and for <100> is 0.219 eV taken over all the thicknesses used.

Figure 4:
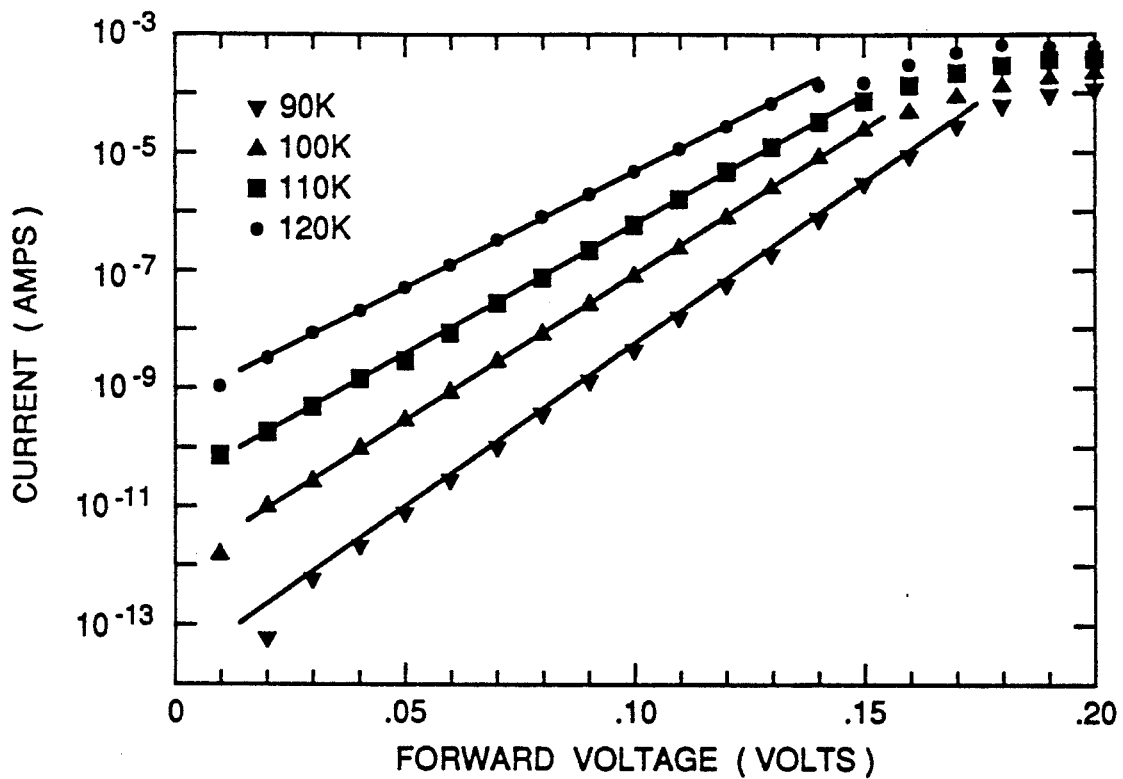
FIG. 4 is a graph which illustrates the forward current characteristics of a infrared diode of the present invention.
Figure 5:
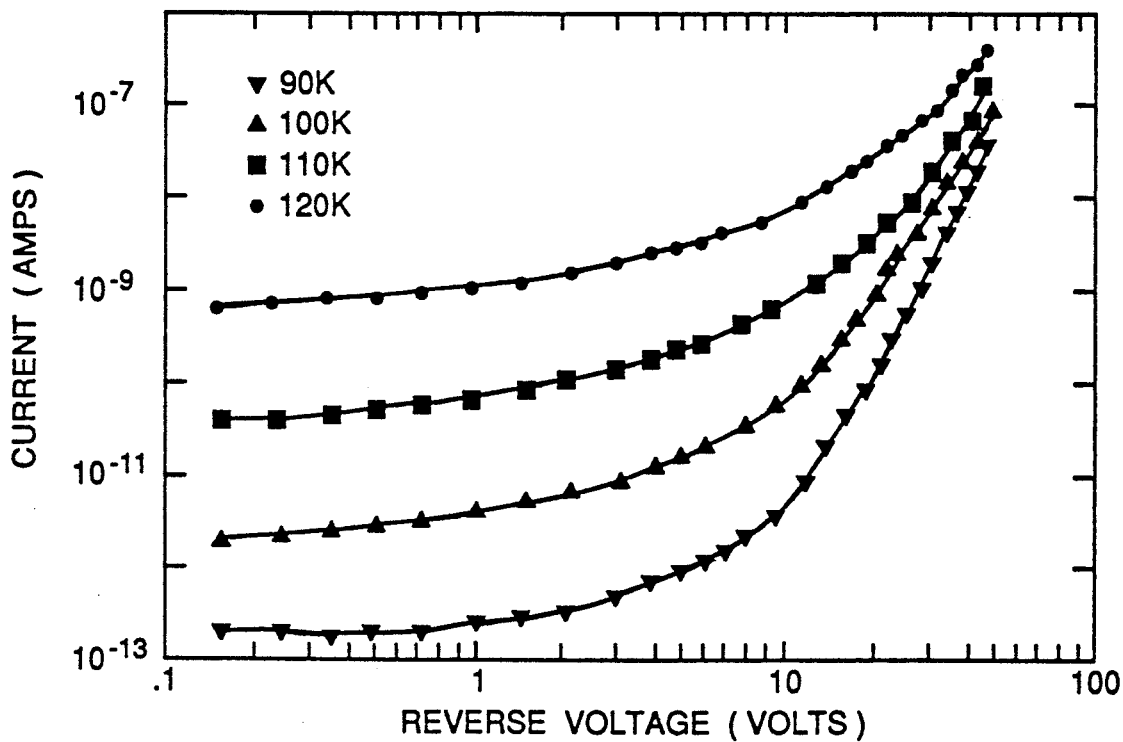
FIG. 5 illustrates the reverse current characteristics of the present invention.

The diodes are further analyzed using current voltage characteristics. The following equations describe hot carrier emission over an electronic barrier between a metal and semiconductor.

$$J = J_{sat} [exp(qV/nkT) - 1]$$

where:
$J_{sat} = A_r T^2 exp[-q\phi_e/kT]$
q=electronic charge
k=Boltzmann's Constant
T=Diode operating temperature
$A_r$=Richardson constant for holes
n=Ideality factor The form of this equation is the same as that for a semiconductor pn junction, except that $J_{sat}$ results from thermal emission of the electronic carriers rather than carrier diffusion which is the mechanism in pn junctions. The ideality factor, n, is a measure of the amount of current in the device due to barrier emission. Values of n close to unity imply that the current mechanism of the diode is mainly caused by Schottky emission. For the diodes used in these experiments, ideality factors were in a range of 1.04 to 1.08. FIGS. 4 and 5 show the forward and reverse current characteristics for a typical infrared diode fabricated on a <111> substrate. All photon sources have been removed to assure that only electrical currents are measured. The forward characteristic is linear in current on a semilogarithmic plot over several orders of magnitude in current allowing an excellent measure of ideality factor. The reverse saturation current density at 110° K. for a diode whose area is $2 \times 10^{-3}$ is $1.2 \times 10^{-8}$ amps/cm². At this current level it is possible to use passive cooling in space.

Figure 6:
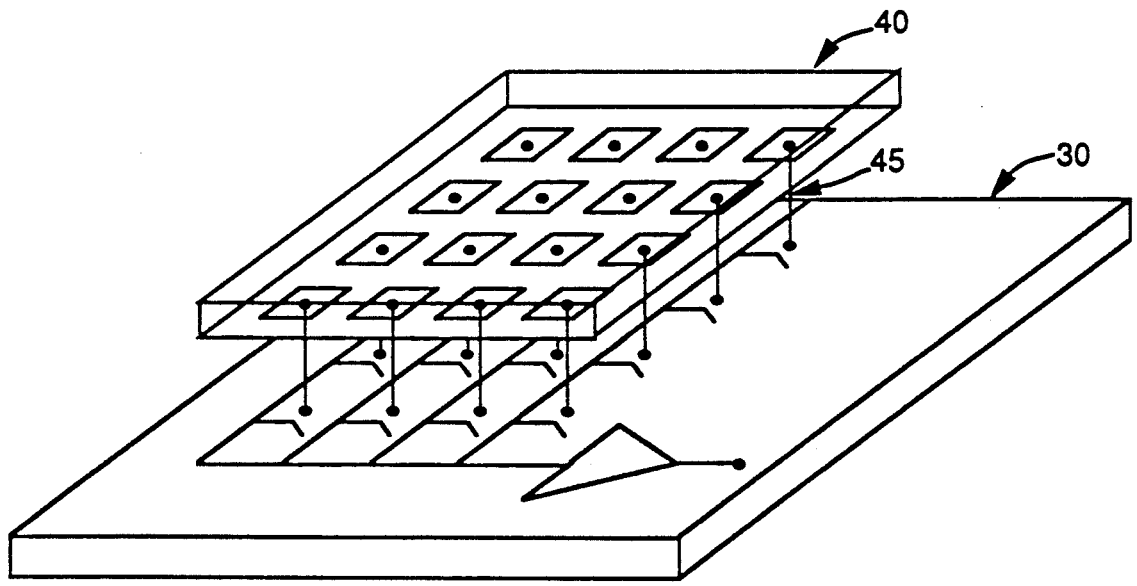
FIG. 6 shows a diagram of a focal plane which is bump bonded with a multiplexer.

These new detectors allow Schottky barrier infrared detectors to be operated at temperatures in the 110° K. temperature range. We have tested and proven this thesis on single devices in our experiments. It is required in future work to make large two dimensional ordered arrays of these detectors. Arrays as large as 1024×1024 should be possible with this technology. Multiplexing structures are also a consideration in making a successful focal plane array. The detector array for this technology is built in nonstandard substrates of <111> silicon. The multiplexer, or signal extraction circuit, must be constructed on industry standard <100> substrates. The multiplexer and the detector array will need to be made on separate wafers. The devices can be intimately mated together by using a technique known as bump bonding of the detector to the multiplexer. FIG. 6 shows a diagram of how this can be accomplished. FIG. 6 is a diagram of a focal plane which is bump bonded with a multiplexer. Bump bonding is accomplished by pressing metal contacts together so that they bond.

All other detector materials such as PtSi on <100>, InSb, HgCdTe, or extrinsic silicon, Si:X, have extremely difficult cooling requirements. They would all need active cooling with a closed cycle refrigerator with extensive moving parts. The lifetime of such a cooler is not compatible with the extended 10 year mission times anticipated in a space environment. The new detectors will allow space systems to use the high reliability passive cooling.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. An infrared diode produced by a process, said infrared diode being capable of operating at temperatures up to about 110° K. and needing only passive cooling in space applications, said process comprising the steps of:

passivating a silicon substrate which has a <111> crystal orientation, said silicon substrate having a first surface and an opposed second surface;

doping a p+ layer on the first surface of the silicon substrate to begin forming a substrate contact area;

placing an n-type guard ring on the first surface of the silicon substrate to circumscribe a detector portion of the infrared diode and suppress edge leakage;

fabricating a platinum silicide detector portion of the infrared diode with an infrared detector mask design which produces a photodetector barrier height that can use up to 0.310 electron volts, said barrier height thereby producing a wavelength cutoff of about 4.0 microns so that the infrared diode can operate at temperatures of up to about 110° K. so that only passive cooling of the infrared diode is required in space applications;

removing excess amounts of the platinum silicide from passivated areas of the silicon substrate; and metallizing the substrate contact area and the guard ring.

2. An infrared diode, as defined in claim 1, wherein said passivating step is performed by oxidizing said silicon substrate with $SiO_2$ to leave thereby a protection layer which will encompass said guard ring.

3. An infrared diode, as defined in claim 1, wherein said fabricating step is performed by evaporating platinum onto the silicon substrate which is exposed within the guard ring, said platinum reacting in contact with the silicon to produce thereby a PtSi detector portion of the infrared diode.

4. An infrared diode which is capable of operating at temperatures in the 110° K. range, said detector comprising:

a silicon substrate having a <111> crystal orientation having a first and an opposed second surface, a layer of platinum silicide formed on said first surface of said silicon substrate, and which has a barrier height of about 0.31 ev., said barrier height producing a wavelength cutoff of about 4.0 microns so that the infrared diode can operate at temperatures of up to about 110° K. so that it only requires passive cooling in space applications; and first and second contact means for making ohmic contact with said layer of platinum silicide and with said silicon substrate respectively.

* * * * *